(12) United States Patent
Terashita et al.

(10) Patent No.: US 11,063,160 B2
(45) Date of Patent: Jul. 13, 2021

(54) SOLAR CELL MODULE

(71) Applicant: KANEKA CORPORATION, Osaka (JP)

(72) Inventors: Toru Terashita, Osaka (JP); Kunta Yoshikawa, Osaka (JP)

(73) Assignee: KANEKA CORPORATION, Osaka (JP)

( * ) Notice: Subject to any disclaimer, the term of this patent is extended or adjusted under 35 U.S.C. 154(b) by 0 days.

(21) Appl. No.: 16/556,941

(22) Filed: Aug. 30, 2019

(65) Prior Publication Data

US 2019/0393369 A1 Dec. 26, 2019

Related U.S. Application Data

(63) Continuation of application No. PCT/JP2018/000885, filed on Jan. 15, 2018.

(30) Foreign Application Priority Data

Mar. 3, 2017 (JP) .............................. JP2017-041159

(51) Int. Cl.
*H01L 31/0224* (2006.01)
*H01L 31/02* (2006.01)
*H01L 31/05* (2014.01)

(52) U.S. Cl.
CPC ........... *H01L 31/022425* (2013.01); *H01L 31/02013* (2013.01); *H01L 31/0504* (2013.01)

(58) Field of Classification Search
CPC ....... H01L 31/022425; H01L 31/02013; H01L 31/022433; H01L 31/0504
See application file for complete search history.

(56) References Cited

U.S. PATENT DOCUMENTS 5,951,786 A * 9/1999 Gee ..................... H01L 31/0512
136/256
10,186,627 B2 * 1/2019 Fukushima ............. H01L 31/18
(Continued)

FOREIGN PATENT DOCUMENTS

| EP | 2562820 A1 | 2/2013 |
| JP | 2005-167158 A | 6/2005 |

(Continued)

OTHER PUBLICATIONS

International Preliminary Report on Patentability issued in International Application No. PCT/JP2018/000885, dated Sep. 12, 2019 (7 pages).

(Continued)

*Primary Examiner* — Golam Mowla
(74) *Attorney, Agent, or Firm* — Osha Bergman Watanabe & Burton LLP

(57) ABSTRACT

A solar cell module includes a solar cell string including a plurality of solar cells connected through a wiring member. The solar cell includes a photoelectric conversion section, a light-receiving-surface electrode disposed on a light-receiving surface of the photoelectric conversion section, and a metal film disposed on a back face of the photoelectric conversion section. The metal film has a plurality of openings along the extending direction of the wiring member, in a connection region between the solar cell and the wiring member. The wiring member is connected through an adhesive layer to the metal film and to the photoelectric conversion section exposed from the openings of the metal film or an electrode fixed on the photoelectric conversion section. There is a non-bonding portion between the metal film and the photoelectric conversion section.

7 Claims, 4 Drawing Sheets

(56) References Cited

U.S. PATENT DOCUMENTS

| | | | |
|---|---|---|---|
| 2004/0200522 A1* | 10/2004 | Fukawa | H01L 31/0504 136/259 |
| 2008/0276981 A1* | 11/2008 | Kinoshita | H01L 31/0747 136/244 |
| 2009/0050190 A1* | 2/2009 | Nishida | H01L 31/0516 136/244 |
| 2009/0126788 A1* | 5/2009 | Hishida | H01L 31/0682 136/256 |
| 2009/0159116 A1* | 6/2009 | Umetani | H01L 31/0508 136/251 |
| 2009/0272419 A1* | 11/2009 | Sakamoto | H01L 31/022425 136/244 |
| 2009/0277491 A1* | 11/2009 | Nakamura | H01L 31/0504 136/244 |
| 2009/0301557 A1* | 12/2009 | Agostinelli | H01L 31/1868 136/256 |
| 2010/0116314 A1* | 5/2010 | Fukushima | C09J 11/04 136/244 |
| 2010/0243024 A1* | 9/2010 | Hashimoto | H01L 31/0512 136/244 |
| 2012/0031457 A1* | 2/2012 | Taira | H01L 31/0508 136/244 |
| 2012/0103385 A1 | 5/2012 | Hong et al. | |
| 2012/0305047 A1* | 12/2012 | Taira | H01L 31/022433 136/244 |
| 2015/0200324 A1* | 7/2015 | Fukushima | C09J 9/02 438/67 |
| 2015/0372169 A1* | 12/2015 | Uto | H01L 31/022433 136/244 |
| 2016/0329862 A1 | 11/2016 | Yoshikawa et al. | |

FOREIGN PATENT DOCUMENTS

| | | |
|---|---|---|
| JP | 2011-228418 A | 11/2011 |
| JP | 2016-167641 A | 9/2016 |
| JP | 2016-189433 A | 11/2016 |
| WO | 2014/112053 A1 | 7/2014 |
| WO | 2015/098872 A1 | 7/2015 |

OTHER PUBLICATIONS

International Search Report issued in International Application No. PCT/JP2018/000885, dated Feb. 13, 2018 (2 pages).
Written Opinion issued in International Application No. PCT/JP2018/000885, dated Feb. 13, 2018(4 pages).

* cited by examiner

SOLAR CELL MODULE

TECHNICAL FIELD

One or more embodiments of the present invention relate to a solar cell module.

BACKGROUND

A crystalline-based solar cell using a crystalline semiconductor substrate such as a single-crystalline silicon substrate or a polycrystalline silicon substrate includes a patterned metal electrode on the light-receiving side. In a monofacial light-receiving type solar cell, a metal film is disposed on substantially the entire back side of the cell for the purpose of effectively utilizing light reaching a back surface without being absorbed by a semiconductor substrate, or improving carrier collection efficiency.

Since one crystalline-based solar cell has a small area, in a practical use, a solar cell string obtained by electrically connecting a plurality of cells through a wiring member (interconnector) is modularized by encapsulating the solar cell string between a glass plate on the light-receiving side and a back seat on the back side. When a solar cell module is used outdoors for a long period of time, a difference in dimensional change between a cell and a wiring member may cause peeling of the wiring member from the cell, warpage of the cell, breakage of the cell, and the like, resulting in deterioration of characteristics.

Patent Document 1 discloses a solar cell module obtained by using solder, etc. to connect a wiring member onto an Al film electrode disposed on the back surface of a cell, and then disposing a metal foil such as a copper foil so as to cover the film electrode and the wiring member. In this module, the metal foil covering the film electrode and the wiring member contributes to reduction of a series resistance, so that the thickness of the wiring member can be reduced. Thus, a stress on a connection portion between the cell and the wiring member can be reduced, so that warpage and breakage of the cell can be suppressed.

Patent Document 2 suggests that a silicon substrate is exposed under an opening formed on a film electrode on a back surface, and the silicon substrate is connected to a wiring member through a conductive adhesive to improve the adhesiveness of the wiring member. In a solar cell of PERC (passivated emitter and rear cell) structure as disclosed in Patent Document 3, etc., a film metal electrode is formed on a passivation film on the back surface of a substrate, and an Ag electrode provided so as to be exposed from an opening of the metal electrode is solder-connected to a wiring member to improve adhesiveness between the cell and the wiring member.

PATENT DOCUMENTS

Patent Document 1: Japanese Patent Laid-open Publication No. 2005-167158
Patent Document 2: Japanese Patent Laid-open Publication No. 2011-228418
Patent Document 3: Japanese Patent Laid-open Publication No. 2016-189433

The contact resistance may increase when an electrode of a solar cell is partially connected to a wiring member as disclosed in Patent Document 2 and Patent Document 3. On the other hand, when the entire surface of the wiring member is connected to the solar cell, peeling of the wiring member, breakage of the cell or the like may easily occur due to a stress, leading to deterioration of reliability in view of the above-described situations, one or more embodiments of the present invention provide a solar cell module having a small contact resistance between a solar cell and a wiring member, and excellent reliability.

SUMMARY

A solar cell module of one or more embodiments of the present invention includes a solar cell string, which comprises a plurality of solar cells connected through a wiring member, between a light-receiving-surface protection member and a back-surface protection member. The solar cell includes a photoelectric conversion section, a light-receiving-surface electrode disposed on a light-receiving surface of the photoelectric conversion section, and a metal film disposed on a back surface of the photoelectric conversion section.

The metal film has a plurality of openings along an extending direction of the wiring member in a connection region between the cell and the wiring member. On the back side of the solar cell, the wiring member is connected to the metal film through an adhesive layer. Further, the photoelectric conversion section exposed from the opening of the metal film, or an electrode exposed from the opening of the metal film and fixed on the photoelectric conversion section is also connected to the wiring member through the adhesive layer. A non-bonding portion is present between the metal film and the photoelectric conversion section.

In the connection region between the cell and the wiring member in the metal film, the total length of regions where the opening is provided along the extending direction of the wiring member may be 0.3 to 3 times the total length of regions where the opening is not provided. The metal film may be one having as a main component a metal selected from the group consisting of aluminum, copper and silver.

In one or more embodiments of the present invention, a conductive adhesive film is used for connection of the wiring member on the back surface of the solar cell. As the wiring member, one having projection-recess structure on a surface on the light-receiving side may be used.

The solar cell module of one or more embodiments of the present invention has high reliability because deterioration of characteristics due to a temperature change is suppressed.

DETAILED DESCRIPTION OF THE EMBODIMENTS

Figure 1:
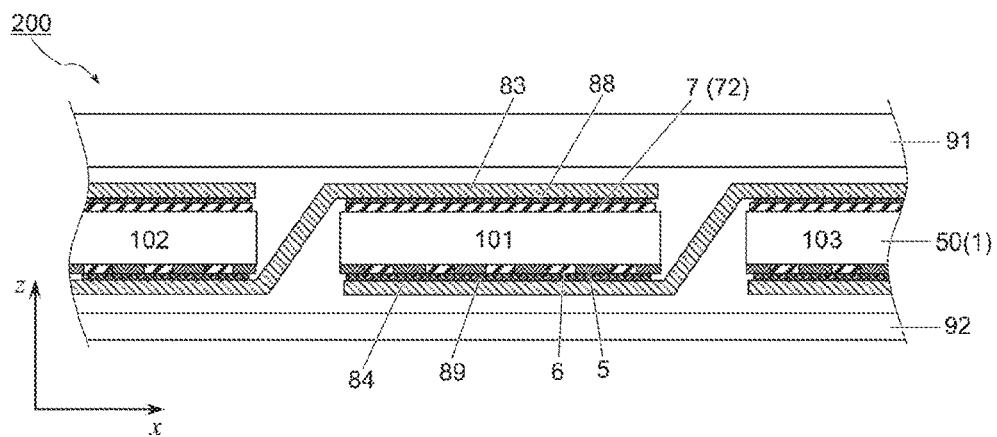
FIG. 1 is a schematic sectional view of a solar cell module according to one or more embodiments of the present invention.

FIG. 1 is a schematic sectional view of a solar cell module (hereinafter, referred to as a "module") according to one or more embodiments of the present invention. A module 200 includes a plurality of solar cells 101, 102 and 103 (hereinafter, referred to as "cells"). Each cell includes an electrode on a light-receiving surface and a back surface of a photoelectric conversion section 50 including a crystalline semiconductor substrate 1.

In the module 200, the top and bottom electrodes of the adjacent cells are interconnected via wiring members 83 and 84 to form a solar cell string. A light-receiving-surface protection member 91 is disposed on the light-receiving side (the upper side in FIG. 1) of the solar cell string, and a back-surface protection member 92 is disposed on the back side (the lower side in FIG. 1) thereof. In the module 200, the solar cell string is encapsulated by filling the space between the protection members 91 and 92 with an encapsulant.

Figure 2:
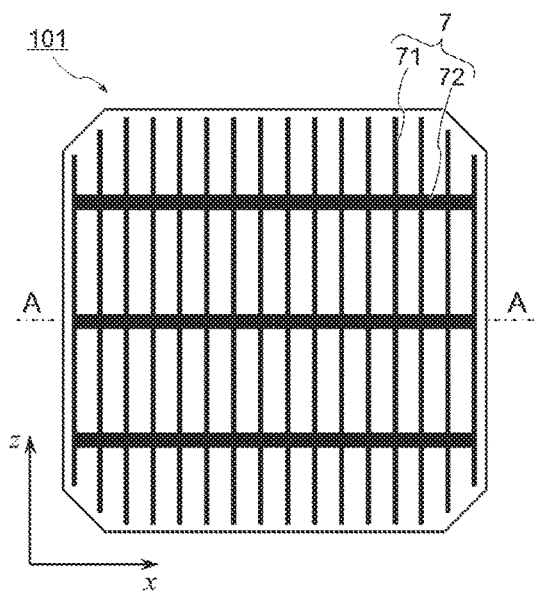
FIG. 2 is a plan view showing an appearance of a light-receiving surface of a solar cell according to one or more embodiments of the present invention.
Figure 3:
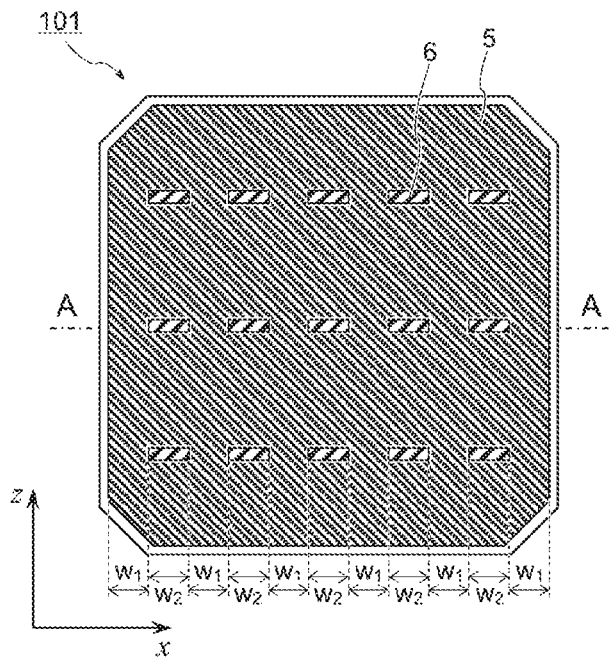
FIG. 3 is a plan view showing an appearance of a back surface of a solar cell according to one or more embodiments of the present invention.
Figure 4:
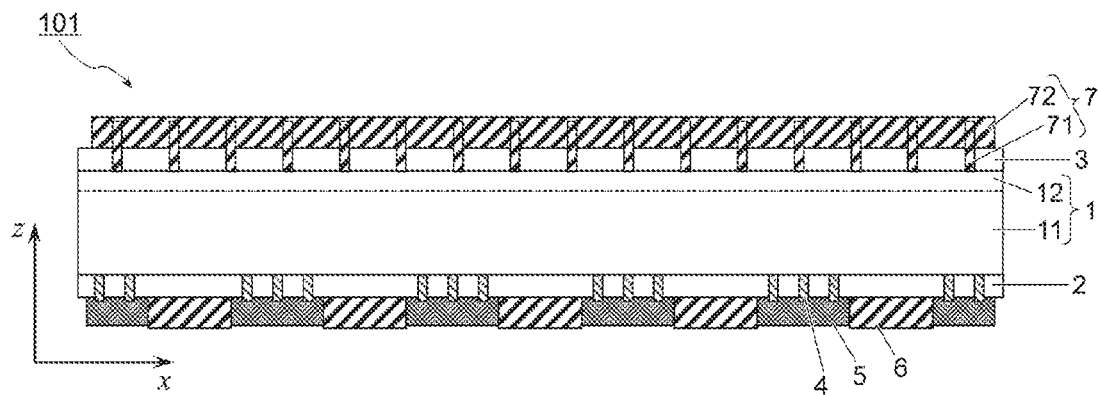
FIG. 4 is a schematic sectional view of a solar cell according to one or more embodiments of the present invention.

FIG. 2 is a plan view of the light-receiving surface of a cell according to one or more embodiments of the present invention, and FIG. 3 is a plan view of a back surface of a cell according to one or more embodiments of the present invention. FIG. 4 is a sectional view taken along line A-A in FIGS. 2 and 3. The cell 101 shown in FIG. 4 is a solar cell of so-called PERC structure, and the photoelectric conversion section 50 includes a silicon substrate 1 as the crystalline semiconductor substrate.

The silicon substrate 1 has a second conductivity-type region 12 on a surface on the light-receiving side of a first conductivity-type region 11. The first conductivity-type region and the second conductivity-type region are semiconductor regions having different conductivity-types, one of which is a p-type and the other of which is an n-type. Hereinafter, the configuration of the cell in FIG. 3 will be described with the first conductivity-type being a p-type and the second conductivity-type being an n-type.

The silicon substrate 1 may be single-crystalline or polycrystalline. The thickness of the silicon substrate 1 is about 100 to 300 μm. The first conductivity-type region 11 of the p-type silicon substrate 1 contains a p-type dopant such as boron or gallium. The second conductivity-type region 12 contains an n-type dopant such as phosphorus. Irregularities having a height of about 1 to 10 μm may be formed on a surface of the silicon substrate 1 on the light-receiving side. When irregularities are formed on the light-receiving surface, the light-receiving area increases and the reflectance decreases, so that optical confinement efficiency is improved. A textured structure may also be provided on the back surface of the silicon substrate.

An anti-reflection layer 3 is disposed on the light-receiving surface (n-type region 12 side) of the silicon substrate 1, and a passivation film 2 is disposed on the back surface (p-type region 11 side) of the silicon substrate 1. The silicon substrate 1, and the anti-reflection layer 3 and the passivation film 2 disposed on the front and back of the silicon substrate 1 form the photoelectric conversion section 50. On the light-receiving surface of the photoelectric conversion section 50, a light-receiving-surface electrode 7 is disposed on the anti-reflection layer 3. On the back surface of the photoelectric conversion section 50, a metal film 5 as an electrode and a back-surface bus bar electrode 6 are disposed on the passivation film 2. In the PERC structure cell, a through electrode 4 extending through the passivation film 2 is formed in addition to the above-mentioned electrodes.

The anti-reflection layer 3 has an effect of increasing the light capture amount into the silicon substrate 1 by reducing the reflectance of light applied to the light-receiving surface of the cell 101. The anti-reflection layer 3 has, for example, a refractive index of about 1.5 to 2.5 and a thickness of about 50 to 120 nm. As a material of the anti-reflection layer 3, an insulating material such as silicon oxide, silicon nitride, silicon oxynitride, aluminum oxide, aluminum oxynitride or silicon may be used.

The passivation film 2 disposed on the back surface of the silicon substrate 1 has an effect of providing a passivation effect on the silicon substrate 1 and reducing carrier recombination. The thickness of the passivation film 2 is, for example, about 10 to 200 nm. As a material of the passivation film 2, an insulating material such as aluminum oxide may be used. When a passivation film having negative charge, e.g. aluminum oxide, is used, electrons which are minority carriers are moved away from the interface between the substrate 1 and the passivation film 2 by a field effect, so that recombination of minority carriers can be reduced. When the first conductivity-type region of the silicon substrate 1 is n-type, a material having positive charge, such as silicon nitride, as a passivation film disposed on the back surface may be used in one or more embodiments.

The light-receiving-surface electrode 7 has a predetermined pattern shape, so that light can be captured from a portion where no metal electrode is provided. The pattern shape of the metal electrode, although not particularly limited, may be a grid shape including a plurality of finger electrodes 71 arranged in parallel, and bus bar electrodes 72 extending orthogonally to the finger electrodes as shown in FIG. 2.

The finger electrode 71 is an electrode for collecting photocarriers produced in the silicon substrate 1, and transporting the photocarriers to the bus bar electrodes 72. As shown in FIG. 4, the finger electrodes 71 are formed so as to extend through the anti-reflection layer 3 to the n-type region 12 of the substrate 1. For example, by printing a silver paste onto the anti-reflection layer and heating the silver paste, a silver electrode extending through the anti-reflection layer can be formed (fire-through method). The width of the finger electrode 71 is, for example, about 30 to 200 μm, and the finger electrodes 71 are spaced at intervals of about 1 to 3 mm.

The bus bar electrode 72 is an electrode for extracting photocarriers transported from the finger electrodes to the outside of the cell, and in the module, a wiring member 83 is connected to the bus bar electrode 72. The width of the bus bar electrode 72 is, for example, about 0.3 to 5 mm, and about 2 to 5 bus bar electrodes are provided in one cell. In FIG. 4, the bus bar electrode 72 is disposed on the anti-reflection layer 3, but like the finger electrode, the bus bar electrode may extend through the anti-reflection layer.

The through electrode 4 is formed so as to extend through the passivation film 2. One end of the through electrode 4 is in contact with the first conductivity-type region 11 of the silicon substrate 1, and the other end is in contact with the film electrode 5. The through electrode 4 has a dot shape or belt shape in plan view, and is disposed on the entire back surface of the silicon substrate 1. Examples of the method for forming a hole extending through the passivation film 2 include a method in which a through-hole reaching the substrate 1 is formed by laser processing; and a fire-through method. When the through electrode 4 including aluminum is formed by the fire-through method, a back surface field (BSF) region (not shown) can be formed due to diffusion of aluminum into the silicon substrate 1. In one or more embodiments, the through electrode 4 may have a diameter (width) of about 60 to 500 μm, and a pitch of about 300 to 2000 μm.

The film electrode 5 is a metal film disposed so as to cover the passivation film 2 and the through electrode 4, and has an effect of collecting carriers from the through electrode 4, and transporting the carriers to the back-surface bus bar electrode 6 or the wiring member 84. In one or more embodiments, the film electrode 5 may be provided to cover substantially the entire surface of the back surface of the substrate, and be in contact with all the through electrodes 4 disposed on the back surface of the substrate. The thickness of the film electrode 5 is, for example, about 3 to 100 μm.

The film electrode 5 has an opening, and the back-surface bus bar electrode 6 is exposed from the opening. A plurality of back-surface bus bar electrodes 6 is linearly arranged along one direction as shown in FIG. 3. The back-surface bus bar electrode 6 may be formed so as to extend through the passivation film 2 to the silicon substrate 1. The back-surface bus bar electrode 6 has a thickness of about 1 to 30 μm and a width of about 0.3 to 5 mm. The back-surface bus bar electrode 6 can be formed by, for example, applying a conductive paste containing silver as a main component in a predetermined shape by screen printing or the like, and then firing the paste.

Figure 5A:
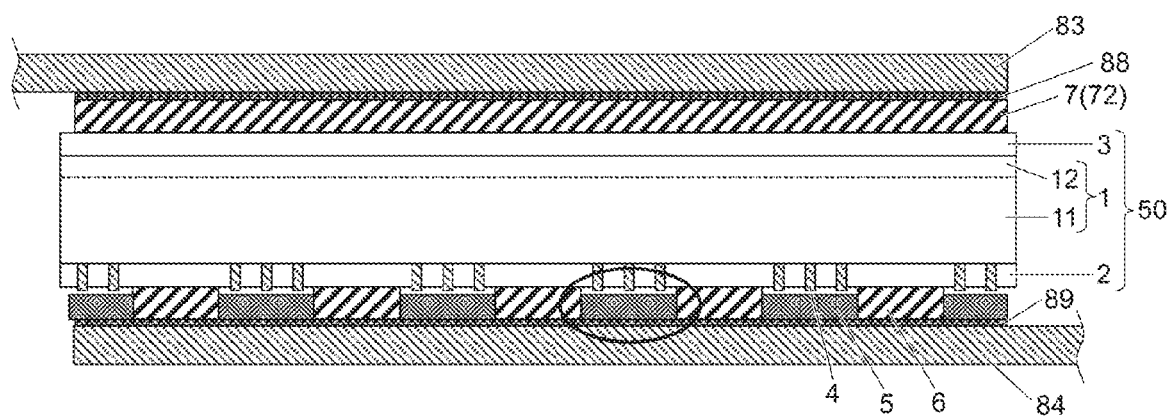
FIG. 5A is a schematic sectional view of a solar cell according to one or more embodiments of the present invention to which a wiring member is connected.
Figure 5B:
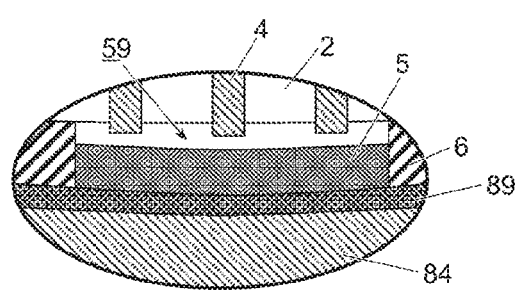
FIG. 5B is an enlarged view of the boxed part of FIG. 5A.

FIG. 5A is a schematic sectional view of a cell according to one or more embodiments of the present invention to which wiring members 83 and 84 are connected. FIG. 5B is an enlarged view of the boxed part of FIG. 5A, which shows a bonding state of electrodes on the back side of the cell. As shown in FIG. 5A, wiring members 83 and 84 are connected to the bus bar electrode 72 on the light-receiving surface and the electrodes 5 and 6 on the back surface through the adhesive layers 88 and 89, respectively. The bus bar electrode 72 on the light-receiving surface of one of two adjacent cells are connected to the back-surface bus bar electrode 6 of the other cell through the wiring member to form a solar cell string. For the wiring members 83 and 84, a copper foil, a plated copper foil or the like is used. By using a wiring member having projection-recess structure (so-called light diffusion tab wire) on the light-receiving side, light incident to the wiring member can be scattered, and light re-reflected at the light-receiving-surface protection member 91 can be captured in the cell, so that the light utilization efficiency of the module is enhanced.

On the back surface of the cell, a region where the bus bar electrodes 6 are linearly arranged is a connection region between the cell and the wiring member 84. In this connection region, regions where the film electrode 5 is provided and regions where the bus bar electrode 6 is exposed from the opening of the film electrode 5 are alternately arranged along the extending direction (x direction) of the wiring member.

In a general PERC cell, a conductive paste containing aluminum as a main component is applied by screen printing etc. on the passivation film and the through electrode, and fired to form a film electrode having an opening in a bus bar electrode-formed region. The film electrode is in a bonding state to the passivation film and the through electrode on the back surface of the cell, and is physically and electrically connected to the back-surface bus bar electrode. In a module using a general PERC cell, the back-surface bus bar electrode is electrically connected to the wiring member by solder bonding, and the film electrode is not bonded to the wiring member. The photocarriers transported from the through electrode to the film electrode are transported from the film electrode to the wiring member through the bus bar electrode.

In contrast, in the module of one or more embodiments of the present invention, not only the back-surface bus bar electrode 6 but also the film electrode 5 is bonded to the wiring member 84 with the adhesive layer 89 interposed between the film electrode 5 and the wiring member 84 as shown in FIG. 5A. A non-bonding portion exists between the film electrode 5 and the back surface of the photoelectric conversion section 50 where the passivation film 2 and the through electrode 4 are disposed. In one or more embodiments of the present invention, the "non-bonding" may be a non-contact state in which, as shown in FIG. 5B, a space 59 is present between the film electrode 5 and the back surface of the photoelectric conversion section 50. Further, even if the film electrode 5 and the back surface of the photoelectric conversion section 50 are in contact with each other, they are in a "non-bonding state" when they can be peeled from each other if a physical external force of pressing, adsorption, static electricity or the like is not applied. On the other hand, when the film electrode 5 and the back surface of the photoelectric conversion section 50 are bonded to each other with an adhesive layer interposed therebetween, such as an adhesive or solder, or with a film formed therebetween in an adhering state by printing, plating, CVD, sputtering or the like, they are not in a "non-bonding state".

Since the film electrode 5 has a non-bonding portion between the film electrode 5 and the back surface of the photoelectric conversion section 50 having the through electrode 4, electrical connection between the photoelectric conversion section 50 and the film electrode 5 may be insufficient in the string before modularization by encapsulation. On the other hand, in the module after encapsulation, the film electrode 5 adheres to the back surface of the photoelectric conversion section 50 under the pressure of encapsulation, and therefore electrical connection between the through electrode 4 on the back surface of the cell and the film electrode 5 can be secured.

The module of one or more embodiments of the present invention has a non-bonding portion between the film electrode 5 and the photoelectric conversion section 50, and therefore even when a dimensional change of the cell or the wiring member occurs due to a temperature change, concentration of a stress can be avoided, so that peeling of the wiring member from the cell, breakage of the cell or the like can be suppressed. Further, the film electrode 5 is bonded and electrically connected to the wiring member 84 with the adhesive layer 89 interposed therebetween, and therefore even when breakage or the like of the wiring member occurs due to a temperature change, carriers can be transported in the surface of the cell through the film electrode 5, so that an increase in resistance can be suppressed. Thus, the module of one or more embodiments of the present invention is excellent in temperature cycle durability, and has high reliability.

For example, a metal foil is used as the film electrode 5, which has a noncontact portion between the photoelectric conversion section 50. A metal foil having an opening at a position corresponding to a back-surface bus bar electrode 6-formed portion is disposed on the photoelectric conversion section 50 to expose the back-surface bus bar electrode 6 from the opening of the metal foil. In this state, the wiring member is connected through an electroconductive material such as a conductive adhesive or solder, so that the back-surface bus bar electrode 6 and the metal foil as the film electrode 5 are connected to the wiring member 84 through the adhesive layer 89. The back-surface bus bar electrode 6 is fixed on the photoelectric conversion section 50, and therefore the wiring member 84 is connected to the back-surface bus bar electrode 6 and the film electrode 5 through the adhesive layer 89 to fix the position of the film electrode 5 in a non-bonding state with the photoelectric conversion section 50 on the back surface of the photoelectric conversion section.

After formation of the film electrode 5 on the back surface of the photoelectric conversion section 50, the film electrode may be peeled from the photoelectric conversion section to form a non-bonding portion. For example, as in the case of a general PERC cell, the film electrode 5 is formed on the back surface (the passivation film 2 and the through electrode 4) of the photoelectric conversion section 50 by printing etc., and the back-surface bus bar electrode 6 and the film electrode 5 are connected to the wiring member 84 through the adhesive layer 89. When a stress is applied in a state in which the wiring member 84 is firmly bonded to the film electrode 5 by the adhesive layer 89, delamination occurs at the interface between the photoelectric conversion section 50 and the film electrode 5, so that a non-bonding portion can be formed.

When the wiring member is connected using solder as an adhesive layer, application of a stress easily causes delamination at the solder connection interface of the film electrode because the film electrode having aluminum as a main component has low adhesiveness with solder. On the other hand, when a conductive adhesive is used as the material of the adhesive layer, the film electrode 5 is firmly bonded to the wiring member 84, so the adhesive strength between the film electrode 5 and the wiring member 84 tends to be higher than the adhesive strength between the film electrode 5 and the photoelectric conversion section 50. Thus, when a stress is applied to the interface, a bonding state between the film electrode 5 and the wiring member 84 with the adhesive layer 89 interposed therebetween is maintained, and delamination easily occurs at the interface between the photoelectric conversion section 50 and the film electrode 5 with relatively low adhesive strength, so that a non-bonding portion can be formed between the film electrode 5 and the photoelectric conversion section 50.

In one or more embodiments of the present invention, for forming a non-bonding portion between the film electrode 5 and the photoelectric conversion section 50 by means of a stress associated with connection between the cell and the wiring member 84, not only the adhesive strength between the wiring member 84 and the film electrode 5 may be high, but also a stress at a connection portion between the cell and the wiring member 84 may be large. For example, when a wiring member having a large width and thickness and high rigidity is used, the cell is easily warped due to a dimensional change after connection, and a stress associated with the warpage peels the film electrode 5 from the photoelectric conversion section 50 as shown in FIG. 5B, so that a space 59 is generated as a non-bonding portion. When the film electrode is peeled from the photoelectric conversion section, a stress is relaxed, and therefore warpage of the cell tends to be eliminated.

When the width of the wiring member is increased, the contact area between the cell and the wiring member can be increased to improve the adhesive strength, but the effect of shadow ingrowth associated with an increase in shading area in the light-receiving surface increases. In one or more embodiments of the present invention, a light diffusion tab wire having projection-recess structure may be used on the light-receiving side. In one or more embodiments of the present invention, a conductive adhesive film as the adhesive layer 89 may be used for bonding the light diffusion tab wire to the back surface of the cell.

The interface between the film electrode 5 and the photoelectric conversion section 50 may be in a non-bonding state as a whole, or may have both a non-bonding portion and a bonding portion. From the viewpoint of reducing a stress between the wiring member and the cell in the module, in one or more embodiments, the film electrode 5 in the wiring member connection region may have a non-bonding portion between the film electrode 5 and the photoelectric conversion section 50. In other words, the film electrode 5 and the photoelectric conversion section 50 may be in a non-bonding state immediately under the wiring member 84. When a stress resulting from connection to the wiring member 84 causes delamination at the interface between the photoelectric conversion section 50 and the film electrode 5 as described above, the film electrode 5 and the photoelectric conversion section 50 immediately under the wiring member 84 can be brought into a non-bonding state.

In the wiring member connection region on the back surface of the cell, the sum of lengths $W_2$ of regions where openings are provided along the extending direction of the wiring member may be 0.3 to 3 times in one or more embodiments, 0.5 to 2 times in another embodiment, and in yet another embodiment 0.7 to 1.5 times the sum of lengths $W_1$ of regions where openings are not provided. When the value of $W_2/W_1$ is excessively large (when the ratio of openings is high), the connection area between the wiring member and the photoelectric conversion section exposed from the opening of the film electrode or the back-surface bus bar electrode fixed on the photoelectric conversion section is large, and therefore when a dimensional change of the cell or the wiring member occurs due to a temperature change, a stress is hardly dissipated. On the other hand, when the value of $W_2/W_1$ is excessively small (when the ratio of openings is low), the connection area between the wiring member and the photoelectric conversion section exposed from the opening of the film electrode or the back-surface bus bar electrode fixed on the photoelectric conversion section is small, so that connection of the wiring member tends to be destabilized. When the value of $W_2/W_1$ is in the above-described range, a stress can be dissipated at a connection portion between the film electrode 5 and the wiring member 84 while a bonding state between the wiring member 84 and the fixed portion (back-surface bus bar electrode 6) of the cell is secured, and therefore the durability of the module can be improved.

In one or more embodiments, the module is obtained by disposing the encapsulant on the light-receiving side and back side of the solar cell string, and carrying out the encapsulation between the light-receiving-surface protection member 91 and the back-surface protection member 92. In one or more embodiments of the present invention, the encapsulant may be a transparent resin such as a polyethylene resin composition containing an olefinic elastomer as a main component, polypropylene, an ethylene/α-olefin copolymer, an ethylene/vinyl acetate copolymer (EVA), an ethylene/vinyl acetate/triallyl isocyanurate (EVAT), polyvinyl butyrate (PVB), silicon, urethane, acrylic, epoxy or the like. The materials of the encapsulants on the light-receiving side and the back side may be the same or different.

The light-receiving-surface protection member 91 is optically transparent, for which glass, transparent plastic, or the like may be used. As the back-surface protection member 92, a light-reflective film may be used in one or more embodiments. As the light-reflective back-surface protection member, one exhibiting a metallic color, a white color, etc. may be used in one or more embodiments, and a white resin film, or a laminate of metal foil such as aluminum sandwiched between resin films, or the like may be used in other embodiments.

With the encapsulant and protection member disposed and laminated on each of the light-receiving side and back side of the solar cell string, thermocompression bonding causes the encapsulant to flow between the cells and to the ends of the module, thereby achieving modularization. The film electrode 5 adheres to the back surface of the photoelectric conversion section 50 under the pressure in modularization, and therefore electrical connection between the through electrode 4 and the film electrode 5 can be secured.

While a module using a PERC structure cell has been described, the configuration of the cell in the solar cell module of one or more embodiments of the present invention is not particularly limited as long as a metal film having an opening is disposed on the back surface of the photoelectric conversion section including the semiconductor substrate. As the metal film, one containing copper, silver or the like as a main component may be used besides aluminum. These metals are excellent in electroconductivity and have a high reflectance to light having a long wavelength, so that infrared light reaching the back surface of the cell without being absorbed by the semiconductor substrate can be reflected to enter the semiconductor substrate again, leading to improvement of light utilization efficiency.

The bus bar electrode is not required to be provided on the back surface of the photoelectric conversion section. When the bus bar electrode is not provided, the photoelectric conversion section exposed under the opening of the metal film may be bonded to the wiring member by a conductive adhesive or the like.

EXAMPLES

Hereinafter, one or more embodiments of the present invention will be described more in detail on the basis of examples, but the present invention is not limited to the examples below.

[Preparation of solar cell]

A PERC cell was prepared as a cell using a single-crystalline silicon substrate. The PERC cell had a phosphorus-doped n-type semiconductor region on the light-receiving side of a 200 μm-thick 6-inch p-type single-crystalline silicon substrate (semi-square shape having a length of 156 nm on each side) having pyramidal irregularities formed on a light-receiving surface, and had a silicon nitride anti-reflection layer disposed on a surface of the n-type semiconductor region. A grid-shaped silver paste electrode consisting of bus bar electrodes and finger electrodes was formed on the anti-reflection layer. An aluminum oxide passivation film was formed on the back side of the silicon substrate, an aluminum through electrode was formed so as to extend through the passivation film, and an aluminum film electrode was formed in contact with the passivation film and the through electrode. As shown in FIG. 3, the film electrode was provided with an opening, and a back-surface bus bar electrode formed by application and firing of an Ag paste was exposed under the opening. The ratio $W_2/W_1$ of the sum of lengths $W_1$ of regions provided with the film electrode and the sum of lengths $W_2$ of regions provided with openings, along the extending direction of the bus bar electrode, was about 0.7. The number of bus bar electrodes was 3 on each of the light-receiving surface and the back surface, the width of the bus bar electrode on the light-receiving surface was 1.5 mm, and the width of the bus bar electrode on the back surface was 3 mm,

[Examination on Film Delamination in Formation of String]

A copper wiring member having a width and a thickness as shown in Table 1 was connected to the PERC cell to prepare a string having nine cells connected in series. For Samples 1 to 3 and 5, a ribbon-shaped solder-plated copper foil having flat front surface and flat back surface was used as a wiring member. For Sample 4, a light diffusion tab wire was used in which a surface of a copper foil having projection-recess structure on the light-receiving side was covered with silver.

The entire light-receiving surface on the bus bar electrode was connected to the wiring member by solder. For Samples 1 to 4, a conductive adhesive film (CF) was disposed on the entire surface of the wiring member connection region on the bus bar electrode and on the film electrode to connect the wiring member of the back side of the cell. For Sample 5, the wiring member on the back side of the cell was connected onto the bus bar electrode by solder connection. The connection of the wiring member using CF was performed at 200° C., and then cooled to room temperature. The back surface of the cell after connection of the wiring member was visually checked to confirm whether the film electrode is peeled off or not. The results are shown in Table 1.

TABLE 1

| | | Wiring member | | | | | Peeling of film electrode |
|---|---|---|---|---|---|---|---|
| | Cell | Width (mm) | Thickness (mm) | Shape of light-receiving surface | back surface adhesive layer Type | Arrangement region | |
| Sample 1 | PERC | 0.3 | 0.3 | Flat | CF | Entire lower surface of wiring member | Not observed |
| Sample 2 | PERC | 0.8 | 0.15 | Flat | CF | Entire lower surface of wiring member | Not observed |
| Sample 3 | PERC | 1.2 | 0.2 | Flat | CF | Entire lower surface of wiring member | Observed |
| Sample 4 | PERC | 1.5 | 0.2 | Projection-recess | CF | Entire lower surface of wiring member | Observed |
| Sample 5 | PERC | 1.5 | 0.2 | Flat | Solder | Only on bus bar | Not observed |

TABLE 1-continued

| | Cell | Wiring member | | | back surface adhesive layer | | Peeling of film electrode |
|---|---|---|---|---|---|---|---|
| | | Width (mm) | Thickness (mm) | Shape of light-receiving surface | Type | Arrangement region | |
| Sample 6 | Heterojunction | 1.5 | 0.2 | Projection-recess | CF | Entire lower surface of wiring member | — |
| Sample 7 | Heterojunction | 1.5 | 0.2 | Flat | Solder | Entire lower surface of wiring member | — |

For Samples 1 to 4 in which the entire surface of the wiring member was connected to the back surface of the cell using CF, the Al film electrode on the back surface tended to be peeled off as the cross-sectional area of the wiring member increased. It is considered that when the wiring member had a large cross-sectional area, there was a large stress at the connection interface between the cell and the wiring member due to a temperature change after bonding in a heating environment, delamination occurred at the interface between the back surface of the cell and the film electrode having relatively low adhesiveness. For Sample 5, in contrast, although a wiring member having a cross-sectional area substantially the same as that for Sample 4 was used, the Al film electrode was not peeled off. This is considered to be because the Al film electrode was not connected to the wiring member on the back surface of the cell.

[Preparation of Module and Temperature Cycle Test]

A solar cell module was prepared using a string of Sample 4 in which the back-surface film electrode was peeled off and a string of Sample 5 in which the back-surface film electrode was not peeled off. An EVA sheet was placed on a white glass plate as a light-receiving side protection member, the solar cell strings were arranged thereon in six rows in such a manner that the distance between adjacent strings was 2 mm, and adjacent strings were electrically connected at the end of the string to connect total 54 solar cells in series. An EVA sheet as a back side encapsulant was placed on the solar cells, and on the EVA sheet, a white light-reflective back sheet obtained by disposing a white resin layer on a base PET film was placed as a back-surface protection member. The laminate was subjected to thermocompression bonding at atmospheric pressure for 5 minutes, and then held at 150° C. for 60 minutes to crosslink the EVA, thereby obtaining a solar cell module.

Figure 6:
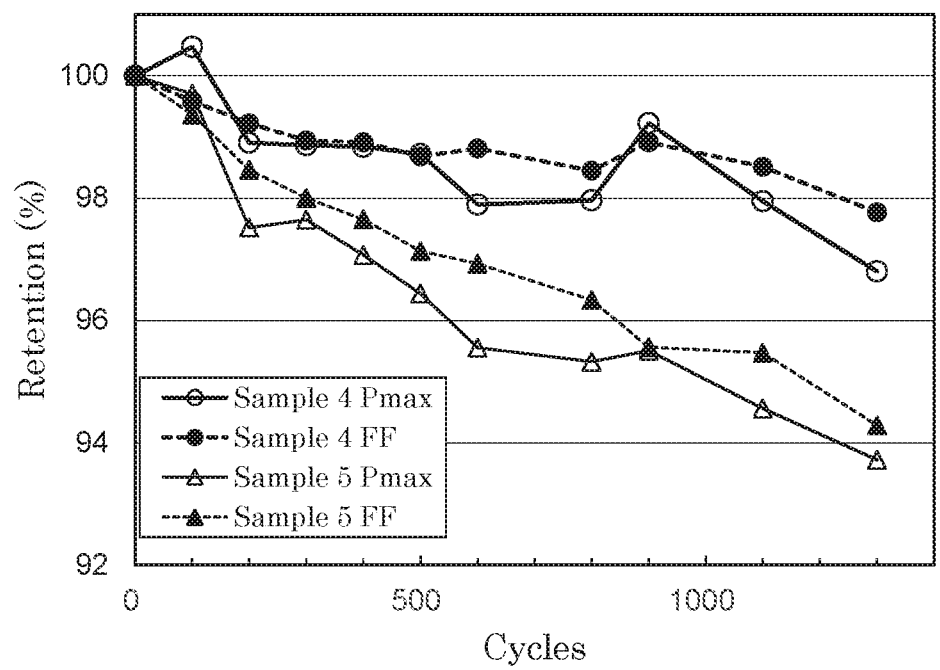
FIG. 6 is a graph showing the results of a temperature cycle test of a solar cell module.

The initial power generation characteristics (short circuit current Isc, open circuit voltage Voc, fill factor FF and maximum power Pmax) of the solar cell module were measured, and a temperature cycle test was then conducted in accordance with IEC61215. The solar cell module was introduced into a test bath, and then subjected to a temperature cycle test. Each temperature cycle includes a process in which the solar cell module is held at 85° C. for 10 minutes, cooled to −40° C. at a rate of 100° C./flour, held at −40° C. for 10 minutes, and heated to 85° C. at a rate of 100° C./hour. The power of the solar cell module was measured after 100 cycles, 200 cycles, 300 cycles, 400 cycles, 500 cycles, 600 cycles, 800 cycles, 1100 cycles and 1300 cycles, and the ratios of the power generation characteristics to the initial power generation characteristics (retentions) of the solar cell module were measured. The retentions of Pmax and FF are shown in FIG. 6.

Reference Example: Evaluation of Module Using Heterojunction Cell

As a cell using a single-crystalline silicon substrate, a heterojunction cell was used, and modularization and cycle tests were conducted in the same manner as in the case of the PERC cell. The heterojunction cell includes an intrinsic amorphous silicon layer; a p-type amorphous silicon layer and an ITO transparent electrode layer on the light-receiving side of a 160 µm-thick 6-inch n-type single-crystalline silicon substrate having pyramidal irregularities provided on the front and back surfaces, and an intrinsic amorphous silicon layer, an n-type amorphous silicon layer and an ITO transparent electrode layer on the back side of the silicon substrate. On each of the light-receiving surface and the back surface, a grid-shaped copper-plated electrode consisting of bus bar electrodes and finger electrodes was formed. On each of the light-receiving surface and the back surface, the number of bus bar electrodes was 3, and the width of each of the bus bar electrodes was 1.5 mm.

A copper wiring member having a width and a thickness as shown in Table 1 was connected to the heterojunction cell to prepare a string having nine cells connected in series. For Sample 6, the same wiring member as that for Sample 4 was used, the entire light-receiving surface on the bus bar electrodes was connected to the wiring member by solder; and the entire back surface on the bus bar electrodes was connected to the wiring member by CF. For Sample 7, the same wiring member as that for Sample 5 was used, and the entire light-receiving surface and back surface on the bus bar electrodes was connected to the wiring member by solder. Using the obtained string, a solar cell module in which 54 cells were connected in series was prepared in the same manner as in the case of Samples 4 and 5, and a temperature cycle test was conducted. The retentions of Pmax and FF every 100 cycles up to 900 cycles are shown in FIG. 7.

Figure 7:
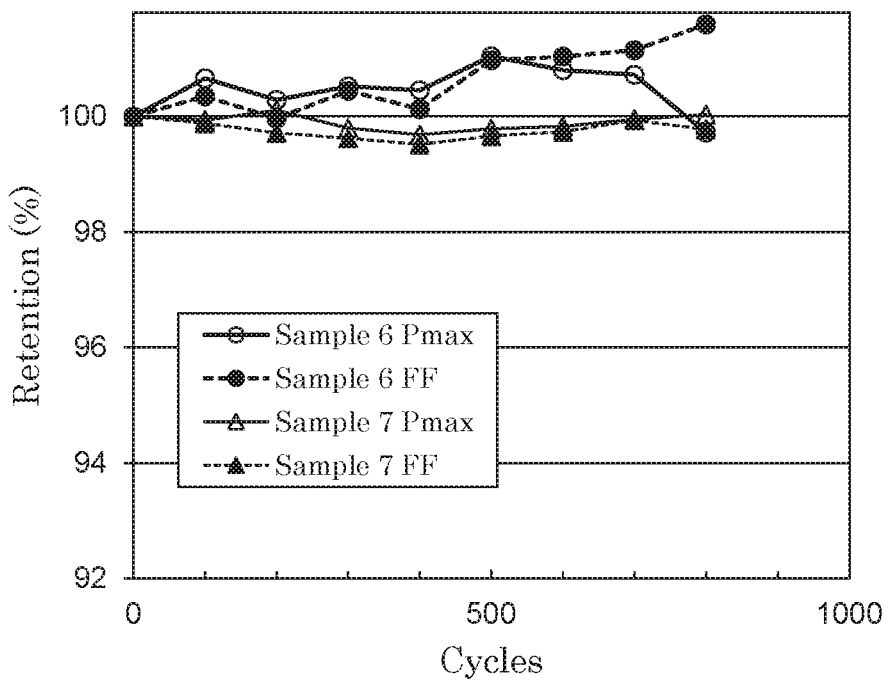
FIG. 7 is a graph showing the results of a temperature cycle test of a solar cell module.

In FIG. 7 showing the results of performing evaluation using heterojunction cells, there was no difference in retention between Sample 6 in which the diffusion wiring member was connected to the back surface of the cell using CF and Sample 7 in which the flat wiring member was connected using solder. These results indicate that the shape of the wiring member and the type of the adhesive layer do not significantly affect the retention.

On the other hand, in FIG. 6 showing the evaluation results PERC cells. Sample 4 in which the back-surface film electrode was peeled off due to connection of the light diffusion wiring member using CF showed higher retention as compared to Sample 5 in which the wiring member was connected onto only the bus bar region using solder. As described above, the shape of the wiring member and the type of the adhesive layer do not significantly affect the retention. Thus, the reason why Sample 4 shows a higher retention as compared to Sample 5 is that the film Al electrode on the back surface of the cell is peeled off, so that the cell is in a non-bonding state. For each of Sample 4 and Sample 5, the retention of the maximum power Pmax is related to the retention of the fill factor, and therefore an increase in resistance due to reduction of the adhesive strength of the wiring member, etc. is considered to cause a decrease in retention.

The above results reveals that for Sample 4, the film Al electrode on the back surface of the cell is connected to the wiring member through the conductive adhesive film and peeled from the photoelectric conversion section to form a non-bonding portion, and therefore even when a dimensional change occurs due to a temperature change, a stress is hardly applied to the bonding interface of the wiring member, and thus the adhesive strength of the wiring member is maintained, so that high temperature cycle durability is exhibited.

Although the disclosure has been described with respect to only a limited number of embodiments, those skilled in the art, having benefit of this disclosure, will appreciate that various other embodiments may be devised without departing from the scope of the present invention. Accordingly the scope of the invention should be limited only by the attached claims.

DESCRIPTION OF REFERENCE CHARACTERS 200 solar cell module
101 to 103 solar cell
50 photoelectric conversion section
1 silicon substrate (crystalline semiconductor substrate)
2 passivation
3 anti-reflection layer
4 through electrode
5 film electrode (metal film)
6 back-surface bus bar electrode
7 light-receiving-surface electrode
71 finger electrode
72 bus bar electrode
83, 84 wiring member
88, 89 adhesive layer
91 light-receiving-surface protection member
92 back-surface protection member

What is claimed is:

1. A solar cell module, comprising:
a solar cell string comprising a plurality of solar cells, a wiring member, and an adhesive layer;
a light-transmissive light-receiving-surface protection member disposed on a light-receiving side of the solar cell string; and
a back-surface protection member disposed on a back side of the solar cell string,
wherein the plurality of solar cells are connected through the wiring member,
wherein each solar cell of the plurality of solar cells comprises a photoelectric conversion section, a light-receiving-surface electrode disposed on a light-receiving surface of the photoelectric conversion section, and a metal film disposed on a back surface of the photoelectric conversion section,
wherein the metal film has a plurality of openings along an extending direction of the wiring member in a connection region between the solar cell and the wiring member,
wherein, through the adhesive layer, the wiring member is connected to the metal film and to a portion exposed from the plurality of openings of the metal film, wherein the portion exposed is the back surface of the photoelectric conversion section or an electrode fixed on the back surface of the photoelectric conversion section,
wherein a non-bonding portion is present between the metal film and the back surface of the photoelectric conversion section,
wherein the non-bonding portion is a space between the metal film and the back surface of the photoelectric conversion section, and
wherein in the non-bonding portion, the metal film and the back surface of the photoelectric conversion section are in contact with each other, but the metal film is not fixed on the back surface of the photoelectric conversion section and is peelable therefrom.

2. The solar cell module according to claim 1, wherein the adhesive layer disposed between the wiring member and the metal film is a conductive adhesive film.

3. The solar cell module according to claim 1, wherein the adhesive layer disposed between the wiring member and the portion exposed is a conductive adhesive film.

4. The solar cell module according to claim 1, wherein in the connection region between the solar cell and the wiring member in the metal film, a total length of regions where the openings are provided along the extending direction of the wiring member is 0.3 to 3 times a total length of regions where the openings are not provided.

5. The solar cell module according to claim 1, wherein the metal film comprises a metal selected from the group consisting of aluminum, copper and silver.

6. The solar cell module according to claim 1, wherein the wiring member has a projection-recess structure on a surface on the light-receiving side.

7. The solar cell module according to claim 1, wherein the adhesive layer disposed between the wiring member and the metal film is conductive adhesive film, and the adhesive layer disposed between the wiring member and the exposed portion is a conductive film.

* * * * *